United States Patent [19]
Takahashi

[11] Patent Number: 5,900,745
[45] Date of Patent: May 4, 1999

[54] SEMICONDUCTOR DEVICE INCLUDING INPUT BUFFER CIRCUIT CAPABLE OF AMPLIFYING INPUT SIGNAL WITH LOW AMPLITUDE IN HIGH SPEED AND UNDER LOW CURRENT CONSUMPTION

[75] Inventor: Hiroyuki Takahashi, Tokyo, Japan

[73] Assignee: NEC Corporation, Tokyo, Japan

[21] Appl. No.: 08/687,964

[22] Filed: Jul. 29, 1996

[30] Foreign Application Priority Data

Jul. 28, 1995 [JP] Japan .................................. 7-193554

[51] Int. Cl.[6] ............................................ G11C 7/00
[52] U.S. Cl. .............................. 326/64; 326/63; 326/65; 326/80; 327/52; 327/409; 327/306
[58] Field of Search ................... 326/64, 63, 65, 326/80; 327/52, 409, 306

[56] References Cited

U.S. PATENT DOCUMENTS

| | | | |
|---|---|---|---|
| 4,667,165 | 5/1987 | De Weck | 330/253 |
| 4,984,202 | 1/1991 | Kawahara et al. | 365/177 |
| 4,984,206 | 1/1991 | Komatsu et al. | 365/208 |
| 5,268,599 | 12/1993 | Matsui | 307/475 |
| 5,373,469 | 12/1994 | Akioka et al. | 365/189.05 |
| 5,491,655 | 2/1996 | Hirose et al. | |
| 5,515,326 | 5/1996 | Hirose et al. | 365/189.11 |
| 5,544,105 | 8/1996 | Hirose et al. | 365/189.11 |
| 5,555,215 | 9/1996 | Nakagome et al. | 365/226 |
| 5,629,900 | 5/1997 | Hirose et al. | 365/230.03 |

OTHER PUBLICATIONS

"Nikkei Electronics", 1993 9, 27 (No. 591), pp. 269–290.

Primary Examiner—Viet Q. Nguyen
Attorney, Agent, or Firm—Sughrue, Mion, Zinn, Macpeak & Seas, PLLC

[57] ABSTRACT

A semiconductor device is arranged by a push-pull circuit 1 for shifting a first center potential of an amplitude of an input signal to a second center potential, and for outputting first and seconc complimentary signals P1, P2 having said second center potential, and further a bipolar type differential amplifier 2 for receiving the first and second complementary signals as input signals thereof.

8 Claims, 6 Drawing Sheets

SEMICONDUCTOR DEVICE INCLUDING INPUT BUFFER CIRCUIT CAPABLE OF AMPLIFYING INPUT SIGNAL WITH LOW AMPLITUDE IN HIGH SPEED AND UNDER LOW CURRENT CONSUMPTION

BACKGROUND OF THE INVENTION

1. Field of the Invention

The present invention relates to a semiconductor circuit and, more specifically, to such a semiconductor circuit that includes a transistor circuit receiving an input signal having a small amplitude.

2. Description of the Related Art

In accordance with rapid development in semiconductor technology, semiconductor integrated circuits (ICs) have been operable in very high frequencies. It is, therefore, required that signal transmission among ICs and further among sets or equipments is also performed at a high speed such as a high frequency range close to 100 MHz. For this purpose, such a new signal transmission method has been proposed that signal transmission is performed with a very small amplitude from one IC (or set) to another IC (or set) instead of employing the TTL (Transistor Transistor Logic) level. Such new signal transmission methods are disclosed in, for example, "NIKKEI ELECTRONICS" 1993, 9, 27 (No. 591), pp. 269–290. One of the new methods is called "GTL" (Gunning Transceiver Logic) Transmission.

In this signal transmission, a signal to be transferred is transmitted through a transmission line with an amplitude of approximately 0.2 V to 0.5 V. Moreover, the reference voltage Vref of the signal is designed to be 0.7 to 1.2 V.

On the other hand, it is necessary for an IC itself to enlarge the amplitude of the signal thus transmitted to perform easy and/or noise-free processing on the received signal. To this end, an input buffer circuit is required to receive the signal transmitted with the GTL level and convert it into such a signal that has a relatively large amplitude.

Figure 1:
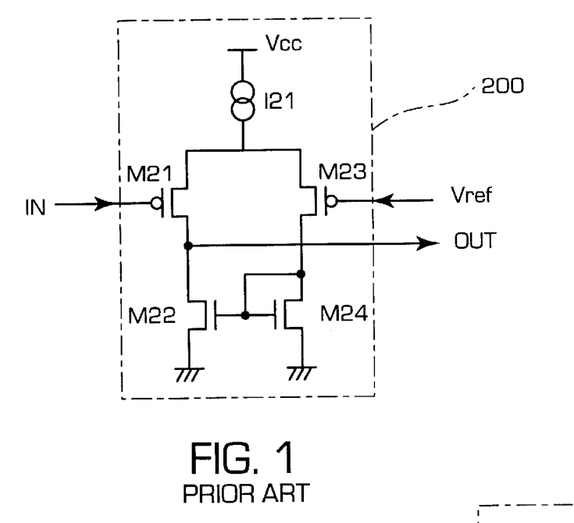
FIG. 1 is a circuit diagram showing one example of the conventional input buffer circuit.

In a conventional technique, a differential amplifier of a MOS type as shown in FIG. 1 is employed as such an input buffer. In FIG. 1, this amplifier 200 includes two P-channel MOS transistors M21 and M23, two N-channel MOS transistors M22 and M24 and one current source I21, which are connected as shown. In particular, an input signal IN having the above small amplitude is supplied to the gate of the transistor M21 and the reference voltage Vref indicative of a center level of the input signal IN is supplied to the gate of the transistor M23. The MOS differential amplifier 200 can thus convert the input signal with the GTL level into a signal with such a level that is larger than the TTL level.

However, the MOS transistor has in general a relatively low current capability. For this reason, it takes a relatively long period of time for the amplifier 200 to convert the input signal IN into a signal with a required amplitude. That is, a significant time delay occurs in the amplifier 200. If each of the MOS transistors M21 to M24 would be constituted with a large size to have large current capability, the period of time for converting the input signal IN into a signal with a large amplitude. In this case, however, power consumption is increased remarkably, and an area on a semiconductor chip occupied by the amplifier 200 is also increased.

It would be therefore considered to employ a differential amplifier of a bipolar type as an input buffer, since a bipolar transistor has higher current capability than a MOS transistor with the same size as a MOS transistor. Moreover, an NPN type bipolar transistor is preferable, since it operates at higher speed than a PNP type transistor.

However, the input signal IN has its center level (i.e., the reference level Vref) that is about 0.7 to 1.2 V as described above. For this reason, the NPN bipolar transistors receiving such a signal do not operate, or operate in saturated conditions.

SUMMARY OF THE INVENTION

It is, therefore, an object of the present invention to provide a semiconductor circuit having an improved input buffer for receiving as input signal with a small amplitude.

It is another object of the present invention to provide a transistor circuit receiving an input signal and producing a level-converted signal at a high speed and with low power consumption.

A semiconductor circuit according to the present invention includes a first transistor circuit receiving an input signal which changes in level with respect to a first center level and outputting an intermediate signal which changes in level with respect to a second center level that is different from the first center level, and a second circuit receiving the intermediate signal and enlarging an amplitude of the intermediate signal to produce an output signal With the above circuit construction, the main role of the first circuit is to level-shut the center level of the input signal such that the second circuit can operate in response to the intermediate signal. Accordingly, the first circuit can be constituted of MOS transistors without lowering operation speed and consuming a large power. The role for enlarging the amplitude of the input signal is thus filled by the second circuit, and hence the second circuit is perferably constituted of bipolar transistors.

As a result, the semiconductor circuit thus constructed receives an input signal with a small amplitude and produces an output signal having a required amplitude at high speed and with low power consumption.

BRIEF DESCRIPTION OF THE DRAWINGS

The above and the objects, features and advantages of the present invention will be more apparent from the following description taken in conjunction with the accompanying drawings, in which.

FIG. .2 is a circuit diagram representing a first embodiment of the present invention.

DETAILED DESCRIPTION OF THE PREFERRED EMBODIMENTS

Figure 2:
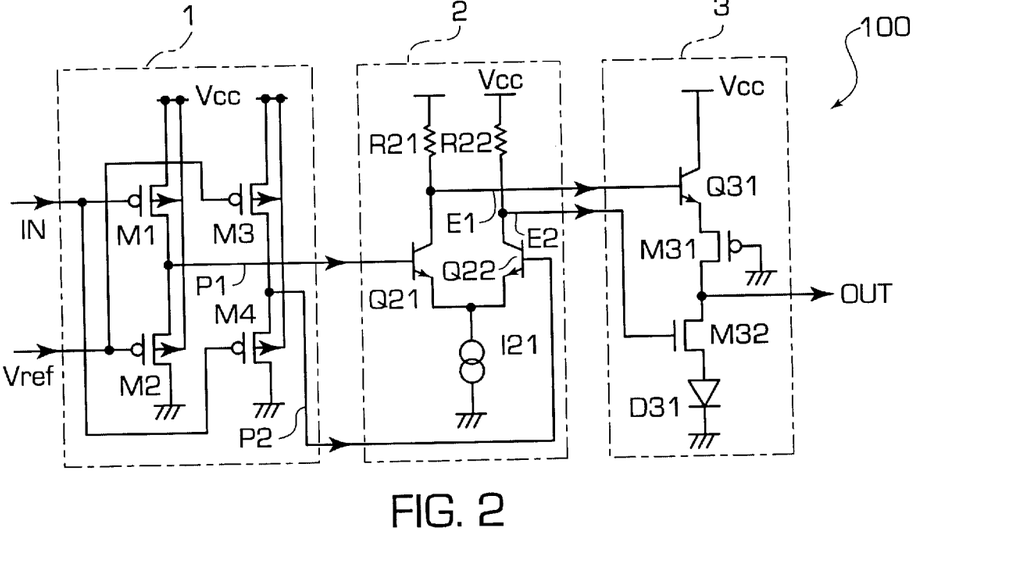

Referring now to drawings, a semiconductor circuit 100 according to a first embodiment of the present invention is constructed as an input buffer for the GTL interface and is composed of a push-pull or first circuit 1, a differential amplifier or second circuit 2, and a level converting circuit 3. The push-pull circuit 1 is constructed of four P-channel MOS transistors M1 to M4. The transistor M1 has a front gate coupled to receive an input signal IN and a source connected to the power supply potential Line Vcc. The transistor M2 has a front gate coupled to receive a reference voltage Vref, a source connected to the drain of the transistor M1, and a drain connected to the ground. As described above, the input signal IN has an amplitude of about 0.2 to 0.5 V, and the reference voltage Vref indicates the center level of the input signal IN, which level is about 0.7 to 1.2 V.

The transistor M3 has a front gate coupled to receive the reference voltage Vref and a source connected to the power supply potential line Vcc. The transistor M4 owns a front gate receiving the input signal IN, and a source connected to the drain of the transistor M3, and a drain connected to the ground. None that the respective back gates of these transistors M1 to M4 are connected to the power supply line Vcc.

Then, this push-pull circuit 1 outputs a first drive signal P1 having a predetermined level and a second drive signal P2 having a preselected level from a junction point between the source of the transistor M1 and the drain of the transistor M2, and from another junction point between the source of the transistor M3 and the drain of the transistor M4. Further note that because of the back gate effects, each of the transistors M2 and M4 has an effective threshold level that is increased or higher than the original threshold level. Accordingly, the center potential of the first and second drive signals P1 and P2 become higher level than the potential of the reference voltage Vref.

Figure 3:
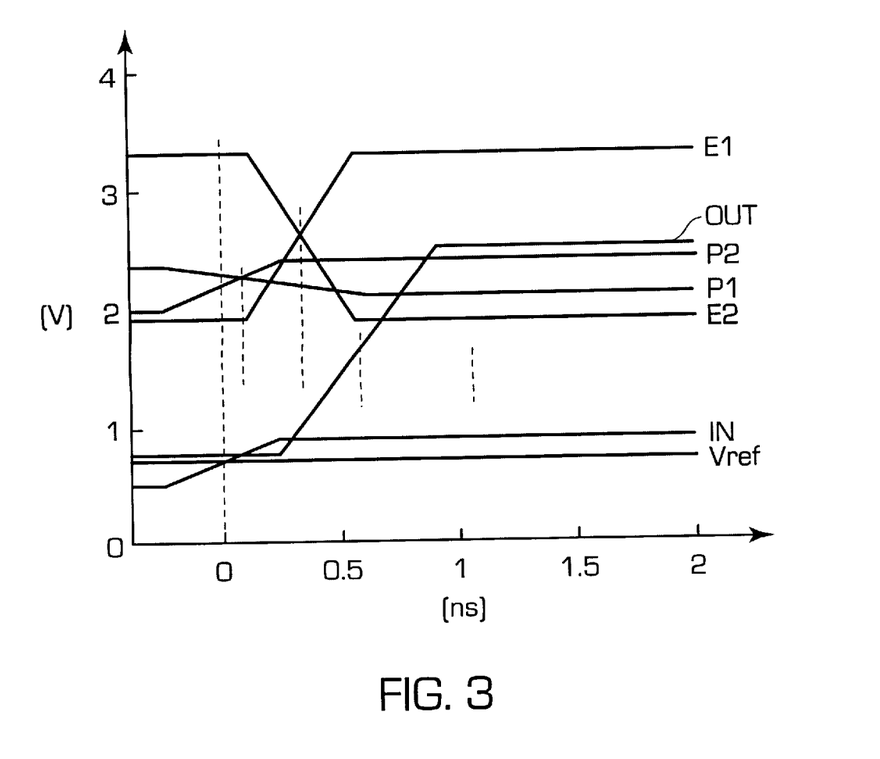
FIG. 3 is a signal wave-form diagram representative of an operation of circuit shown in FIG. 2.
Figure 4:
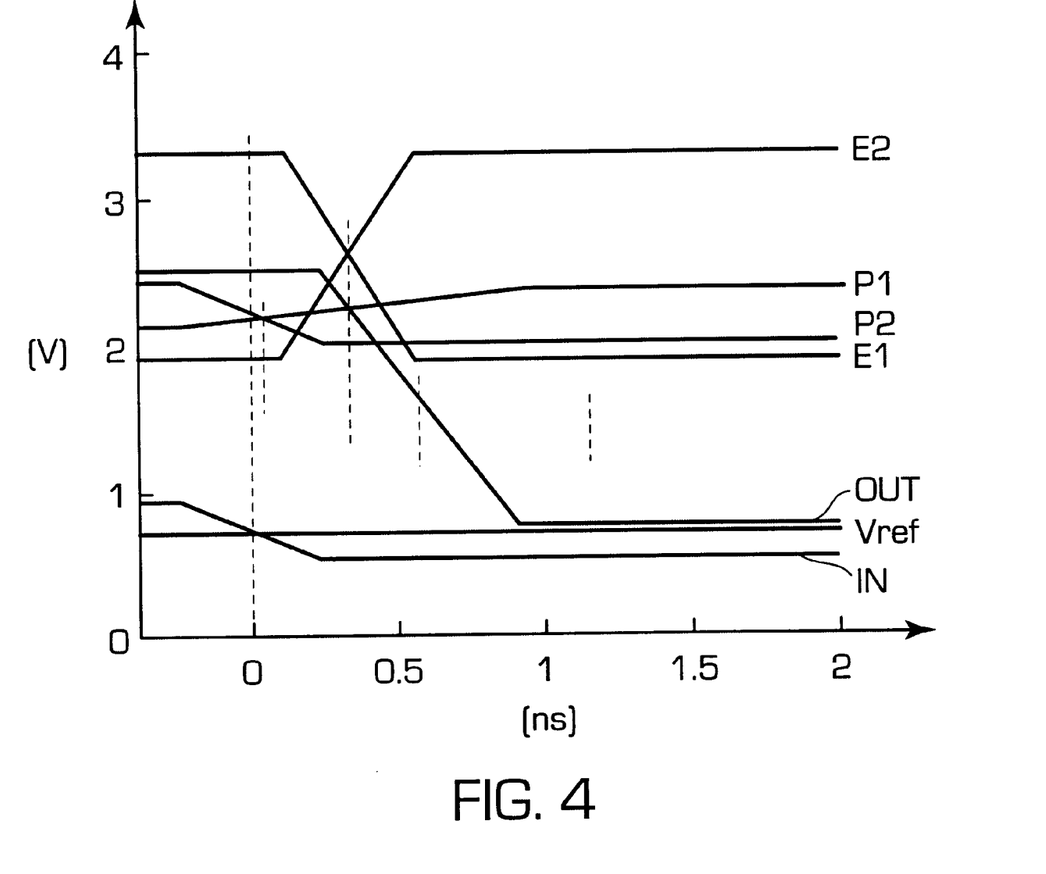
FIG. 4 is a signal wave-form diagram representative of another operation of the circuit shown in FIG. 2.

In more detail, noting at first a circuit construction composed of the transistors M3 and M4, since the transistor M3 receives the power potential Vcc at its source and a reference voltage Vref at its gate, it operates as a current source. On the other hand, the transistor M4 receives the input signal IN at its gate and is connected at its source to the transistor M3. Accordingly, the transistors M3 and M4 constitutes a source-follower circuit, thereby producing the signal P2 which is the same in phase as the input signal, as shown in FIGS. 3 and 4. However, the transistor M4 is subject to the back-bias effect as described above, the signal P2 is level-shifted by the effective threshold level of the transistor M4 which is approximately 1.5 V, as also shown in FIGS. 3 and 4. That is, the signal P2 changes in level with respect to a center level of about 2.2 to 2.7 V and in phase with the input signal IN.

Regarding a circuit construction composed of the transistors M1 and M2, although the signal P1 is derived from the source of the transistor M2 receiving the reference voltage Vref at its gate, the source of the transistor M2 is connected the transistor M1 which serves as a variable impedance element responsive to the input signal M1. Moreover, since the transistor M1 operates as a common-source (or source-grounded) amplifier, the impedance thereof becomes small in response to the low level of the input signal IN and large in response to the high level of the input signal IN. As a result, a signal P1 is shown in FIGS. 3 and 4 is derived from the circuit of the transistors M1 and M2, which has a center level that is level-shifted by approximately the effective threshold level of the transistor M3 and which change in level in approximately opposite phase to the level change of the input signal IN.

Thus, the transistor circuit 1 responds to the input signal IN and the reference voltage Vref indicative of the center level of the input signal IN and produces a set of intermediate signals P1 and P2, both of which change in level in opposite direction to each other and have the respective center level that is level-shifted toward the power potential Vcc from the reference voltage Vref by the effective threshold levels of the transistors M2 and M4. As a result, the differential amplifier 22 composed of including NPN bipolar transistors can operate by the intermediate signals P1 and P2. Moreover, as is also apparent from FIGS. 3 and 4, the amplitude of each of the signals P1 and P2 is approximately equal to that of the input signal IN. In order words, the circuit 1 operates substantially as a level-shift circuit only for level-shifting the center level of the input signal IN. Accordingly, there is no substantial requirement for enhancing the current capability or current driving ability of each of the MOS transistors M1 to M4. Accordingly, each of the transistors M1 to M4 can fill the role of the circuit 1 at a high speed with a small size and small power consumption.

Then, the differential amplifier circuit 2 is arranged as follows. That is, an emitter of a bipolar transistor Q21 is commonly connected with an emitter of another bipolar transistor Q22, and a base of this bipolar transistor Q21 receives the first drive signal P1, and also a base of the bipolar transistor Q22 receives the second drive signal P2. A constant current source I21 is connected between a junction point between the emitters of the bipolar transistors Q21 and Q22, and a ground potential point. Load resistors R21 and R22 are connected between the collectors of these bipolar transistors Q21, Q22, and receiving terminals of the power supply potential Vcc. This differential amplifier 2 differentially amplifies the first and second drive signals P1 and P2, so that first and second differentially amplified signals E1 and E2 are outputted from the collectors of the drive transistors Q21 and Q22, respectively. The first and second differentially amplified signals E1 and E2 own a complementary level relationship between them.

The level converting circuit 3 is arranged as follows. A bipolar transistor Q31 owns a base for receiving the first differentially amplified signal E1 and a collector for receiving the power supply potential Vcc. A source of a pMOS type transistor M31 is connected to an emitter of this bipolar transistor Q31, and a gate thereof is grounded. An nMOS type transistor M32 has a gate for receiving the second differentially amplified signal E2, and a drain connected to the drain of the pMOS type transistor M31. A diode D31 is connected between the source of the transistor M32 and the ground potential to produce a forward-direction voltage. Then, this level converting circuit 3 outputs signals (OUT) having preselected levels produced by converting the first and second differentially amplified signals E1 and E2 from a junction point between the drains of the transistors M31 and M32.

It should be understood that the differential amplifier circuit 2 is arranged by not MOS transistors, but bipolar transistors. In general, an operating speed of a bipolar transistor is faster than that of an MOS transistor. Moreover, according to this differential amplifier circuit arrangement, since the complementary signals are inputted to the bases of the transistors Q21 and Q22, a large output signal can be obtained, as compared with that of the conventional differential amplifier circuit.

However, in order to employ such a differential amplifier circuit 2, the complementary drive signals P1 and P2 must be produced using an input signal. To achieve this purpose, the push-pull circuit 1 is required. In this push-pull circuit 1, the respective MOS transistors M1~M4 need not own the large drive capabilities because the purpose of this circuit 1 is not amplifying the input signal but shifting the potential level of the input signal to higher Level. So, only very small currents are merely supplied to the bases of the bipolar transistors Q21 and Q22 employed within the differential amplifier circuit 2.

Accordingly, the center potential of this low-amplitude input signal may be shifted to higher level at high speed by the push-pull circuit 1. Also, since each of these MOS transistors employed in the push-pull circuit 1 may own the small drive capability, the current consumed in the push-pull circuit 1 becomes low. However, the differential amplifier circuit 2 can maintain the sufficiently large output and the high speed characteristic.

In other words, the input buffer circuit with the high speed characteristic and the low current consumption can be obtained according to the first embodiment of the present invention.

It should be noted that although the level converting circuit 3 is additionally provided under such a condition that the sufficiently large output signal could not be obtained by the differential amplifier 2, a level converting circuit having such a function is not limited thereto, but various types of level converting circuits may be employed (will be explained later).

Next, a description will now be made of operations and also operating conditions about this first input buffer circuit.

Similar to the conventional input buffer circuit, a relatively low voltage on the order of 0.7 V to 1.2 V is applied as the reference voltage Vref in accordance with the GTL standard (rule), and the amplitude level of the input signal IN is selected to be approximately ±(0.2 V to 0.5 V) with respect to this reference voltage Vref also in this first embodiment mode.

A description will now be made of such a case that the reference voltage Vref is selected to be 0.7 V, and the amplitudes of the input signal IN are set to ±0.2 V.

The level of the first drive signal P1 outputted from the push-pull circuit 1 is determined by a ratio of conductivities of the transistors M1 and M2, whereas the level of the second drive signal P2 outputted from the push-pull circuit 1 is determined by a ratio of conductivities of the transistors M3 and M4. When the level of the input signal IN becomes higher than that of the reference voltage Vref, the ability (namely, ON-resistance) of the transistor M1 is decreased, and the phase of this first drive signal P1 is opposite to that of the input signal IN. Also, the ability of the transistor M4 is similarly lowered, so that the level of the second drive signal P2 is changed into the high level, and the phase of this second drive signal P2 is equal to the phase of the input signal IN (namely, in-phase state).

It should be noted that the voltages of these first and second drive signals P1 and P2 are set to high within such a voltage range that the bipolar transistors Q21 and Q22 of the differential amplifier circuit 2 provided at the subsequent stage are not saturated, and further are set to suitable values for driving these transistors Q21 and Q22 (for instance, large operating margin and so on). Assuming now that the power supply voltage Vcc is selected to be 3.3 V, the first and second drive signals P1 and P2 are approximated to 2.5 V because of the back gate effects. That is to say, a center potential of the input signal is shifted. Also, since the differential amplifier circuit owns the high amplification due to the employment of the bipolar transistors Q21 and Q22, the amplitudes of the first and second drive signals P1 and P2 may be selected to be on the order of 0.2 V.

The differential amplifier circuit 2 shunts the current supplied from the constant current source I21 in response to the conductivity conditions of the transistors Q21 and Q22, and outputs the first and second differentially amplified signals E1 and E2 due to the voltage drops produced in the load resistors R21 and R22. As a result, the amplitudes of the first and second differentially amplified signals E1 and E2 may be controlled by the current value of the constant current source I21, the resistance values of the load resistors R21 and R22, and the like. In this embodiment mode, the amplitudes of these differentially amplified signals E1 and E2 are selected to be on the order of 1 V to 1.5 V, taking account of the operating margin of the level converting circuit 3 provided at the next stage.

In the level converting circuit 3 which have received the differentially amplified signals E1 and E2, the ON ability (capability) of the transistor Q31 is controlled in response to the first differentia-ly amplified signal E1, and the ON ability of the transistor M32 is controlled in response to the second differentially amplified signal E2 in a complementary manner so as to convert the levels of these differentially amplified signals E1 and E2, so that the output signals (OUT) having the large amplitudes are derived therefrom.

Subsequently, a transition response characteristic of the input buffer circuit according to this first embodiment mode will now be described with reference to FIG. 3 and FIG. 4. That is, FIG. 3 graphically represents operating waveforms when the level of the input signal IN is changed from the low level into the high level with respect to the reference voltage Vref, whereas FIG. 4 graphically shows operating waveforms when the level of this input signal IN is changed from the high level into the low level.

The second drive signal P2 will be varied in the same changing trend as that of the input signal IN, whereas the first drive signal P1 will be varied in such a way that the amplitude thereof becomes relatively small and represents a not sharp change. This is because a gate-to-drain capacitance of the pMOS type transistor M4 may function as a driver of the output voltage with the in-phase operation with respect to the second drive signal P2. In the push-pull circuit 1, the pull-up transistor M1 and the pull-down transistor M4 may immediately respond to the levels of the input signals IN, and may change the ON-abilities thereof to thereby directly output the input signals as the first and second drive signals P1 and P2. Since the push-pull circuit 1 is operated under low amplitude, the operation speed thereof may become very fast such as approximately 0.1 ns.

Also, since the differential amplifier circuit 2 is equivalent to the general-purpose ECL (Emitter-Coupled Logic) circuit suitable for the high speed operation, this differential amplifier circuit 2 may output the differentially amplified signals at high speed on the order of 0.3 ns.

Similarly, since the first and second differentially amplified signals E1 and E2 having the sufficiently large amplitudes are supplied to the level converting circuit 3, and furthermore the ON-abilities of the transistors M31 and M32 are controlled by these complementary type differentially amplified signals E1 and E2, this level converting circuit 3 may produce the output signal OUT at high speed on the order of 0.3 ns.

In FIG. 3 and FIG. 4, there are represented the operating waveforms involving the output signal from the driver circuit provided at the post stage of this level converting circuit 3. The overall operating time involving the operating time of this post-staged driver circuit is amount to approximately 1.1 ns. These operating waveforms own substantially no dependency with respect to the level changes in the input signal IN.

Figure 5:
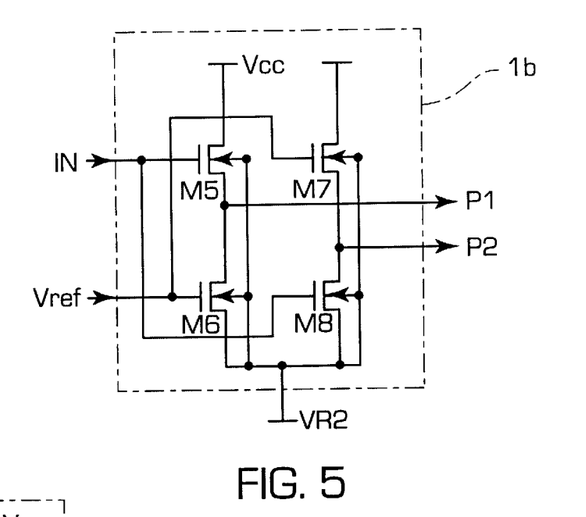
FIG. 5 is a circuit diagram of a push-pull (first) circuit portion according to a second embodiment of the present invention.

FIG. 5 is a circuit arrangement for indicating a push-pull circuit which constitutes a portion of an input buffer circuit according to a second embodiment mode of the present invention. In this third embodiment, the push-pull circuit is constructed of nMOS type transistors. However, since the reference voltage Vref is selected to be approximately 0.7 V in the GTL standard, this reference voltage Vref cannot be directly utilized in this push-pull circuit. Therefore, this push-pull circuit is operable when more higher voltages may be utilized as the reference voltage Vref.

In this case, a high potential of the input signal IN is not preferable because the bipolar transistors Q21, Q22 may become to saturate. So, the push-pull circuit 1b shift the center potential of the input signal IN to lower level of the center potential.

Figure 6:
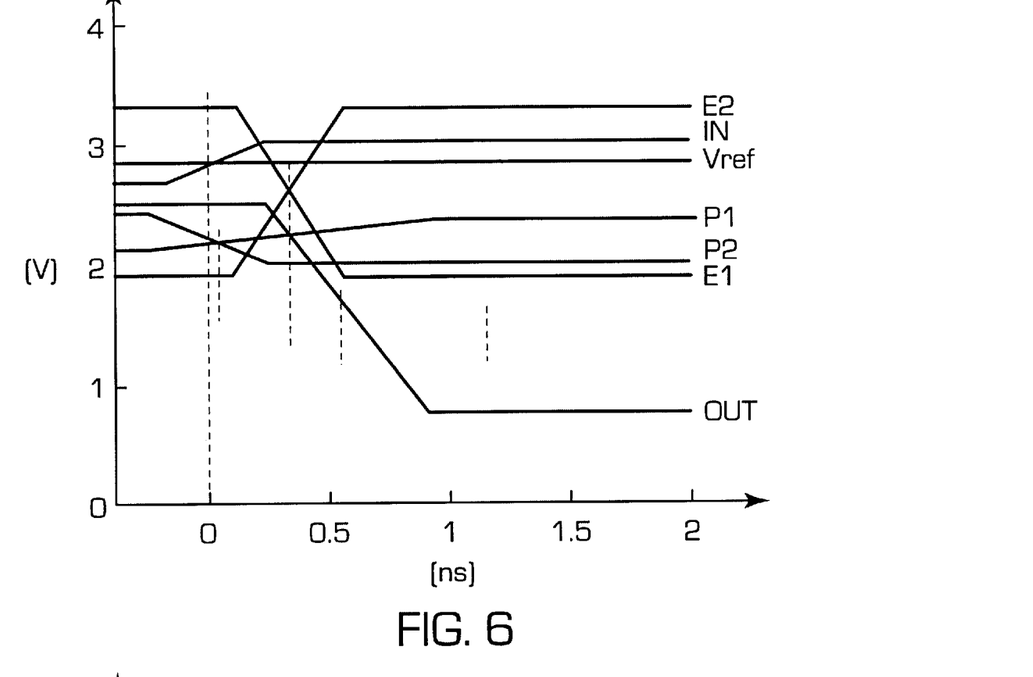
FIG. 6 is a first transition response characteristic diagram of signals appearing at various circuit portions for explaining operations and effects of the embodiment shown in FIG. 5.
Figure 7:
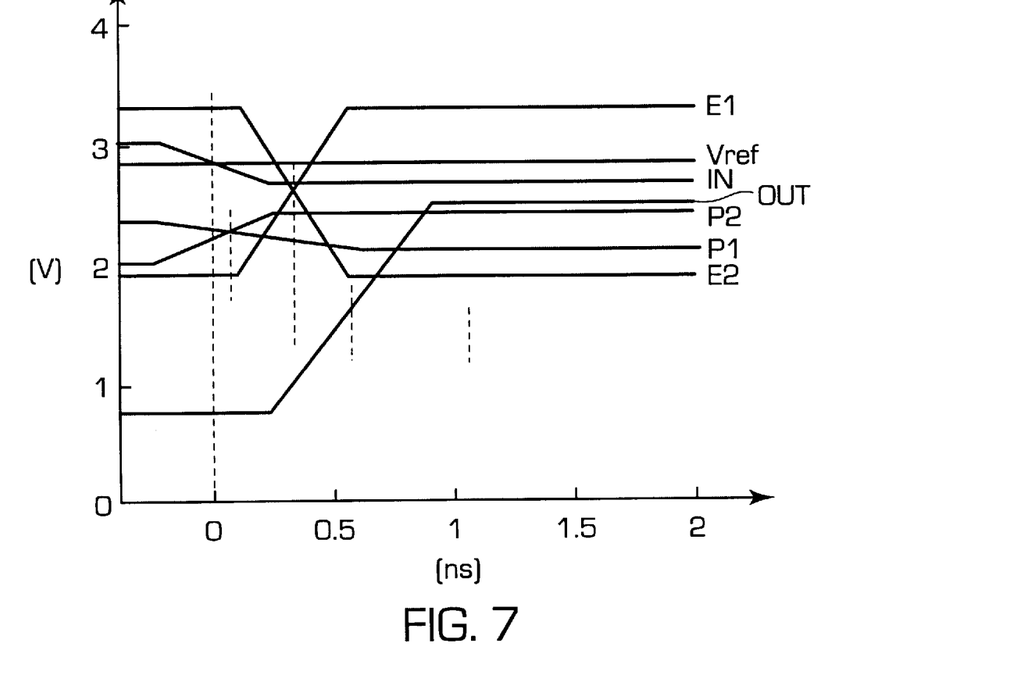
FIG. 7 is a second transition response characteristic diagram of signals appearing at various circuit portions for explaining operations and effects of the embodiment shown in FIG. 5.

A transition response characteristic of the input buffer circuit according to this second embodiment will now be described with reference to FIG. 6 and FIG. 7 as same as the first embodiment.

Figure 8:
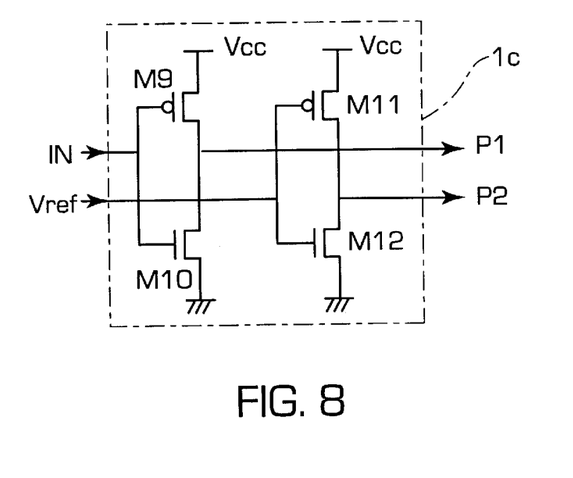
FIG. 8 is a circuit diagram of a push-pull circuit portion according to a third embodiment of the present invention.

FIG. 8 is a circuit diagram for representing a push-pull circuit which constitutes a portion of an input buffer circuit according to a third embodiment mode of the present invention. It should also be noted that the differential amplifier circuit of FIG. 2 according to the first embodiment is connected to this push-pull circuit of FIG. 8 at a post stage.

In this push-pull circuit 1c of the third embodiment, a pMOS type transistor is employed as a pull-up function, and an nMOS type transistor is employed as a pull-down function, and then the same signal is supplied to the gates of these transistors. Namely, this push-pull circuit 1c has the same circuit arrangement as a CMOS type inventer. The transistor for receiving the input signal IN and the transistor for receiving the reference voltage Vref constitute a paired circuit arrangement for outputting the first and second drive signals P1 and P2.

Similar to the above-explained push-pull circuits 1b according to the second embodiment mode, in order to maintain the operating margin of the differential amplifier circuit 2 provided at the post stage.

Figure 9:
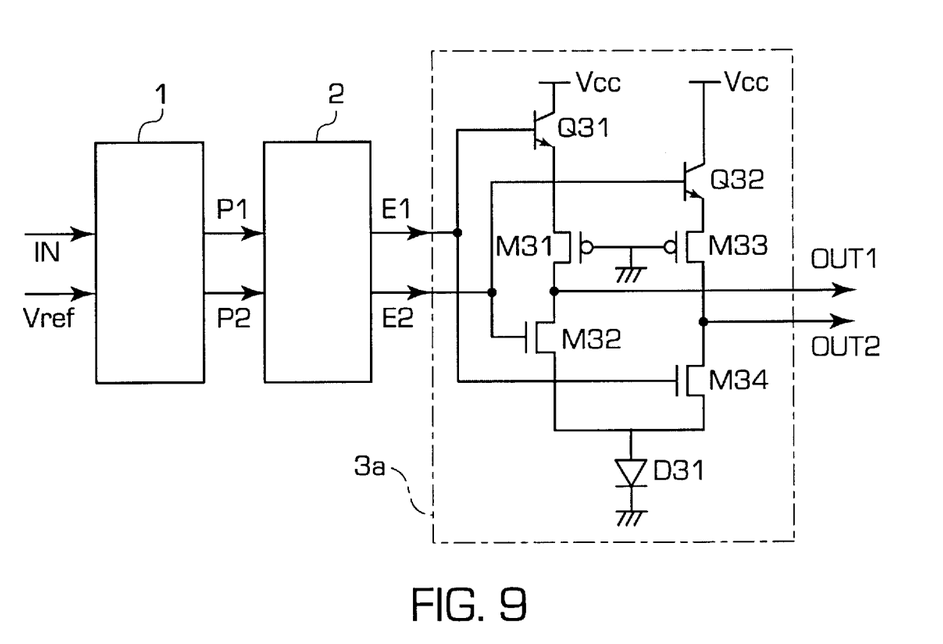
FIG. 9 is a circuit diagram indicating a fourth embodiment of the present invention.

FIG. 9 is a circuit diagram for showing an input buffer circuit according to a fourth embodiment mode of the present invention.

In this fourth embodiment, a level converting circuit 3a is capable of producing complementary output signals OUT1 and OUT2. This level converting circuit 3a of the fourth embodiment is arranged by further employing a bipolar type transistor Q32 whose base receives the second differentially amplified signal E2 and whose collector receives the power supply potential Vcc; a pMOS type transistor M33 whose gate receives the ground potential, and whose source is connected to an emitter of the bipolar transistor Q32; and an nMOS type transistor M34 whose gate receives the first differentially amplified signal E1, whose drain in connected to a drain of the pMOS type transistor M33, and whose source is connected to the source of the nMOS type transistor M32 in addition to the level converting circuit 3 according to the first embodiment.

Generally speaking, in a memory device, an address signal is received by a buffer circuit, and this address signal is supplied to a decoder circuit, while the respective constructive bits of this address signal are made in a complementary mode. To produce this complementary address signal, an inverter and the like are utilized. As a result, the address signal would be delayed, which is defined by the employment of such an inverter, so that high speed operation of the memory device could not be achieved. Thus, when the circuit according to the fourth embodiment of the present invention is applied to such a circuit, the inverter and the like are no longer required. As a consequence, the resultant circuit can be operated at high speed, and thus tie operating speed of the overall semiconductor integrated circuit can be increased.

Figure 10:
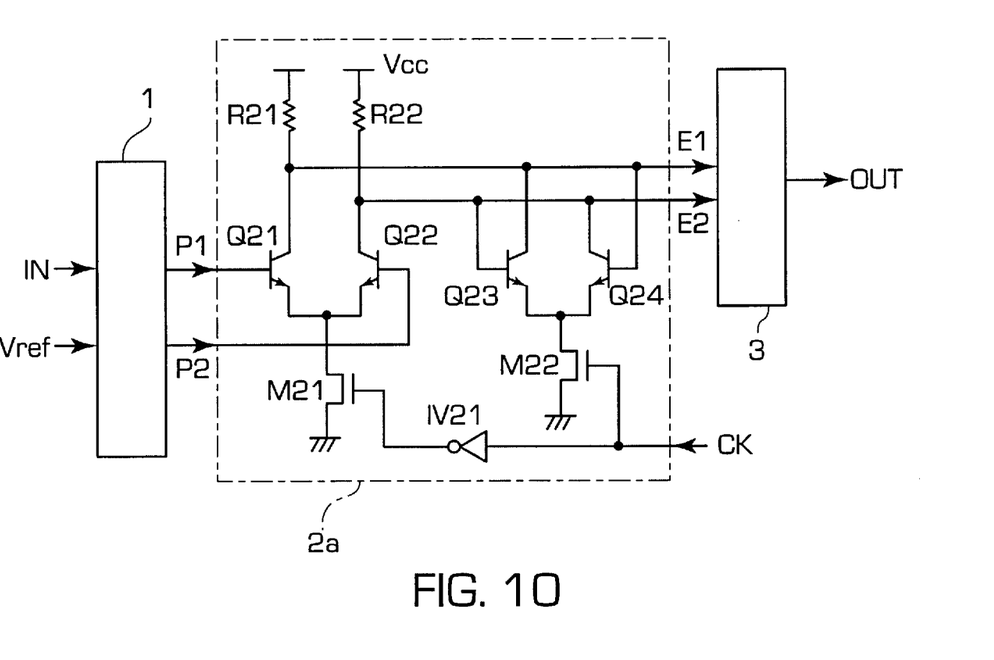
FIG. 10 is a circuit diagram indicating a fifth embodiment of the present invention.

FIG. 10 is a circuit diagram for indicating an input buffer circuit according to a fifth embodiment mode of the present invention.

In accordance with this fifth embodiment, a differential amplifier circuit 2a is arranged by a circuit equipped with a signal holding means for holding the first and second differentially amplified signals E1 and E2 to output these signals at a predetermined timing.

This differential amplifier circuit 2a of the fifth embodiment mode is constructed of a differential amplifying unit and a latch unit. This differential amplifying unit is arranged by bipolar type transistors Q21 and Q22, load resistors R21 and R22, and also a constant current source made of an nMOS type transistor M21. The latch unit is equipped with a bipolar type transistor Q23 whose base receives the second differentially amplified signal E2 from the differential amplifying unit, and whose collector receives the first differentially amplified signal E1. This latch unit is also equipped with another bipolar type transistor Q24 whose base receives the first differentially amplified signal E1, whose collector receives the second differentially amplified signal E2, and whose Emitter is connected to the emitter of the transistor Q23. This latch unit is further comprises of an nMOS type transistor M22 whose gate receives a clock signal CK, whose drain is connected to the emitter of both transistors Q23 and Q24, and whose source receives the ground potential. An inverter IV21 inverts the level of the clock signal, so that the differential amplifying unit is brought into a non-active state at a preselected timing.

When the clock signal CK is under low level, the transistor M21 is turned ON and the transistor M22 is turned OFF, so that the latch unit is brought into a nonactive state and the differential amplifying unit is brought into an active state. At this time, this circuit arrangement becomes essentially similar to that of the differential amplifier circuit 2 shown in FIG. 2, so that the first and second differentially amplified signals E1 and E2 are directly transferred to the level converting circuit 3.

Conversely, when the clock signal CK is under high level, the transistor M21 is turned OFF so that the differential amplifying unit is brought into the non-active state, and further the transistor M22 is turned ON so that the latch unit is brought into the active state. As a consequence, the transistor (either Q23 or Q24) whose base receives one high-leveled signal of the first and second differentially amplified signals E1 and E2 is turned ON, so that this transistor draws the current from the low-leveled signal of the first and second differentially amplified signals E1 and E2, maintains a potential difference thereof, and outputs this potential difference, namely is brought into the latch condition.

In accordance with this fifth embodiment, even when the latch function is added thereto, only the latch unit is merely added to the signal transmission line for the first and second differentially amplified signals E1 and E2. Since the total circuit stage is not increased in the signal transmission path due to this latch unit, there is substantially no delay in the operating speed. In other words, in such a case that the present invention is applied to such a semiconductor integrated circuit which requires a latch circuit (signal holding unit), since this latch unit of the fifth embodiment is no longer made as the conventional cascade-connected latch circuit, the overall operating speed could be increased.

Figure 11:
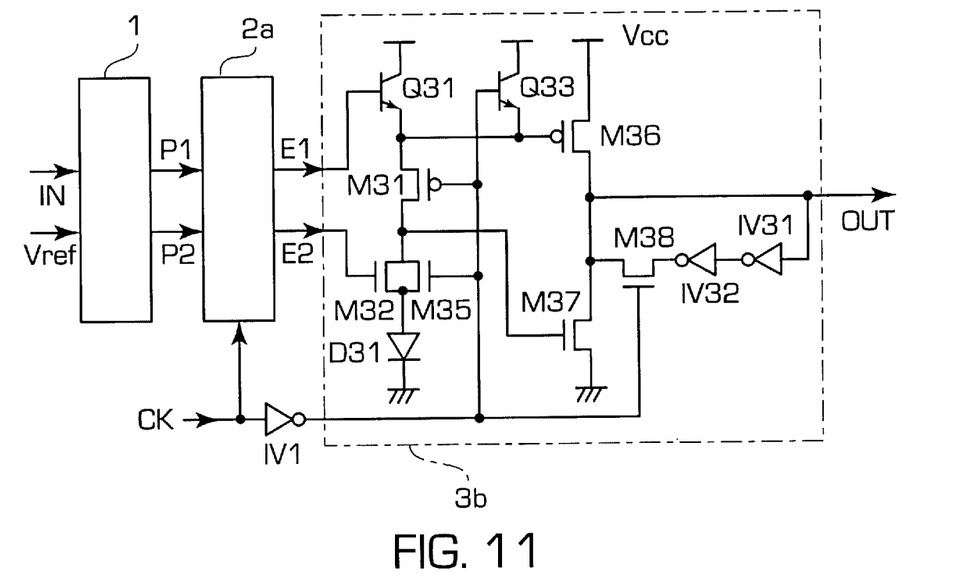
FIG. 11 is a circuit diagram indicating a sixth embodiment of the present invention.

FIG. 11 is a circuit diagram for representing an input buffer circuit according to a sixth embodiment mode of the present invention.

This sixth embodiment mode is arranged in such a manner that in addition to the fifth embodiment mode, a latch function is added also to a level converting circuit 3b, and this level converting circuit 3b constitutes a register circuit together with a differential amplifier circuit 2a having a latch function.

The level converting circuit 3b according to this sixth embodiment mode is constructed of transistors Q31, M31, M32 and a diode D31, corresponding to those of level converting circuit 3 shown in FIG. 1. This level converting circuit 3b further includes a pMOS type transistor M36 whose gate is connected to the emitter of the transistor Q31, and whose source receives the power supply potential Vcc; and an nMOS type transistor M37 whose gate is connected to the drains of the transistors M31 and M32, and whose drain is connected to the drain of the transistor M36. This level converting circuit 3b is further arranged by a bipolar type transistor Q33, another nMOS type transistor M35, an inverter IV31, another inverter IV32, and a further nMOS type transistor M38. In the bipolar transistor Q33, a gate receives a level-inverted signal of the clock signal CK, a collector receives the power supply potential Vcc, and an emitter is connected to the emitter of the transistor Q31. In the nMOS type transistor M35, a gate receives the level-converted signal of the clock signal CK, and each of a source and a drain is connected to each of the source and the drain of the transistor M32. An input terminal of this inverter IV31 is connected to the drains of the transistors M36 and M37, and an input terminal of the inverter IV32 is connected to an output terminal of the inverter IV32. In the nMOS transistor M38, a gate receives the level-inverted signal of the clock signal CK, and each of a source and a drain are connected to the output terminal of the inverter IV32, and the drains of the transistors M36 and M37. An output signal OUT is outputted from a junction point between the drains of the transistors M36 and M37, and the level-inverted signal of the clock signal CK is transferred to the gate of the transistor M31.

With Employment of the above-described circuit arrangement, during the non-latching condition under which the clock signal CK is at a high level, this circuit arrangement of the sixth embodiment may become such a circuit arrangement made by merely adding the transistors M36 and M37 to the circuit arrangement of FIG. 2, essentially speaking. Then, the transistors M36 and M37 are turned ON/OFF in the complimentary manner, so that the output signal can be fully swung from the ground potential Level to the power supply potential Vcc.

During the latching condition, under which the clock signal CK is at a low level, the transistor M31 is turned OFF, and the transistor M35 is turned ON, so that the transistor M37 is turned OFF, and the transistor Q33 is turned OFF to cause the transistor M36 to be turned OFF. Then, the signal line of the output signal OUT is cut off from the pre-stage circuit, and further the transistor M38 is turned ON, so that a close loop may be formed by the inverters IV31, IV32, and the transistor M38, and the output signal OUT is held and outputted.

This latch circuit is controlled in response to the level-inverted signal of the clock signal CK. On the other hand, since the latch unit of the differential amplifier circuit 2a is directly controlled by the clock signal CK itself, such a register function may be realized that the differential amplifier circuit 2a functions as a master latch, whereas the level converting circuit 3b functions as a slave latch.

Figure 12:
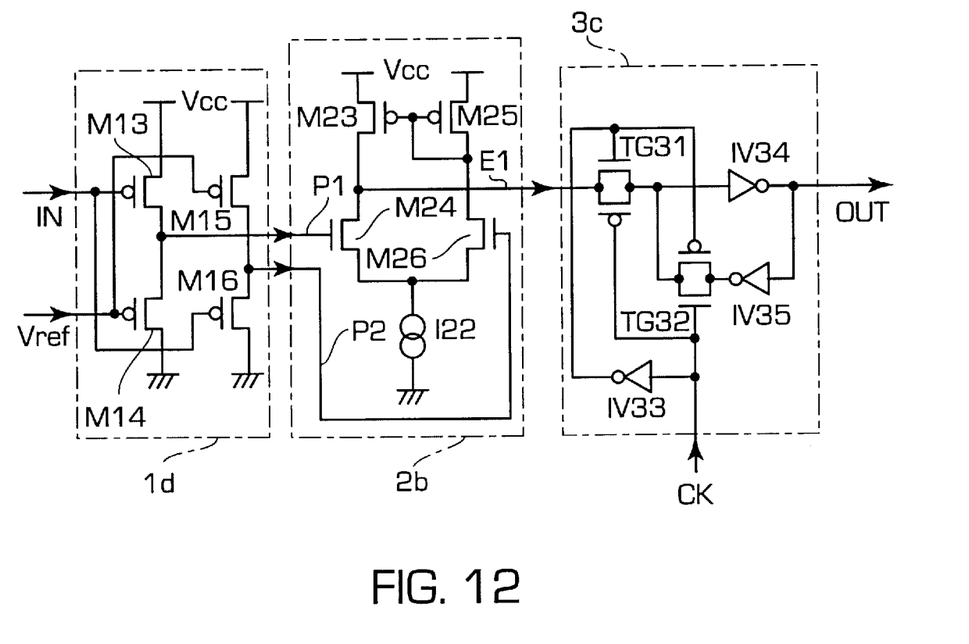
FIG. 12 is a circuit diagram indicating an seventh embodiment of the present invention.

FIG. 12 is a circuit diagram for indicating an input buffer circuit according to an seventh embodiment mode of the present invention.

In this seventh embodiment, driving transistors employed in the differential amplifier circuit 2b are nMOS type Transistors M24 and M26, and further a level converting circuit 3c is arranged by inverters IV34, IV35, and transfer gates TG31, TG32 with a latching function.

The differential amplifier circuit 2b according to this seventh embodiment is arranged by nMOS type drive transistors M24, M25 whose sources are commonly connected to each other, and whose gates receive the first and second drive signals P1, P2; a constant current source I22 connected between the sources of these drive transistors M24, M25, and the ground potential point; and a pMOS type transistor M23 whose source receives the power supply potential Vcc, and whose drain is connected to the drain of the nMOS type drive transistor M24. In this differential amplifier circuit 2b, a current mirror type load circuit is formed by an nMOS type transistor M26 whose source receives the power supply potential Vcc, and whose gate and drain are connected to the gate of the transistor M23 and the drain of the transistor M26, and the pMOS type transistor M25.

The level converting circuit 3c is constructed of a first transfer gate TG31, a first inverter IV34, a second inverter IV35, and a second transfer gate TG32. The first transfer gate TG31 receives at an input terminal thereof the output signal from the differential amplifier circuit 2b, namely the first differentially amplified signal E1, and is brought into the conductive state when the clock signal is at a low level, and then transfers this first differentially amplified signal E1 to an output terminal thereof. The CMOS type first inverter IV34 owns a preselected threshold voltage, and an input terminal for receiving the signal appearing at the output terminal of the first transfer gate TG31. The second inverter IV35 inverts the level of the output signal from the first inverter IV34. The second transfer gate TG32 receives the level-inverted signal derived from the first inverter IV35 at an input terminal thereof, is brought into the conductive state when the clock signal is at the high level, and transfers the signal appearing at the input terminal to the input terminal of the first inverter IV34 connected to an output terminal thereof.

In this seventh embodiment mode, the drive transistors M24 and M26 of the differential amplifier circuit 2b are made of nMOS type transistors having the high transistor ability, and furthermore, a push-pull circuit 1d is so arranged as a circuit capable of shifting the drive signals P1 and P2 to the relatively high voltages in order that these nMOS type transistors M24 and M26 can be driven by this push-pull circuit 1d, and the signals P1 and P2 as the output signals thereof are used to drive these transistors M24 and M26.

A level shift circuit 3c outputs an output signal "OUT" via the first transfer gate TG31 and the first inverter IV34 when the clock signal CK is at a low level. At this time, the first differentially amplified signal E1 is fully swung from the ground potential level to the power supply potential level by way of this first inverter IV34. When the clock signal CK is at a high level, this level shift circuit 3c is cut off from the differential amplifier circuit 2b, and also a latch circuit is formed by the first and second inverters IV34 and IV35, and the second transfer gate TG32. This latch circuit holds such a condition (signal) immediately before the clock signal CK becomes the high level and then outputs it.

In accordance with this seventh embodiment mode, since no bipolar type transistors which have been employed in the previous embodiment modes are utilized, the operating speed of this seventh embodiment mode would be slightly delayed, as compared with the operating speeds of the previous embodiment modes. However, there is a merit that since this seventh embodiment is constructed of only the MOS transistors, the manufacturing cost and the transistor chip area can be reduced.

Although the invention has been described in detail above in connection with various preferred embodiments thereof, it will be appreciated by those skilled in the art that these embodiments have been provided solely for purposes of illustration, and are in no way to be considered as limiting the invention. Instead, various modifications and substitutions of equivalent techniques will be readily apparent to those skilled in the art upon reading this specification, and such modifications and substitutions are to be considered as falling within the true scope and spirit of the following claims.

What is claimed is:

1. A semiconductor circuit comprising a first circuit receiving an input signal which changes in level with respect to a first center level and outputting an intermediate signal which changes in level with respect to a second center level that is different from the first center level, and a second circuit receiving said intermediate signal and enlarging an amplitude of said intermediate signal to produce an output signal.

2. The circuit as claimed in claim 1, wherein said first circuit further receives a reference voltage indicating said first center level and includes a first MOS transistor of a first channel type connected between a first power supply line and a first node and having a front gate supplied with said input signal, a second MOS transistor of said first channel type connected between said first node and a second power supply line and having a front gate supplied with said reference voltage, a third MOS transistor of said first channel type connected between said first power supply line and a second node and having a front gate supplied with said reference voltage, and a fourth MOS transistor of said first channel type connected between said second node and said second power supply line and having a front gate supplied with said input signal, said intermediate signal being led out of one of said first and second nodes.

3. The circuit as claimed in claim 2, each of said first, second, third and fourth MOS transistors further has a back gate connected to one of said first and second power supply lines.

4. The circuit as claimed in claim 3, wherein an additional intermediate signal is further led out of the other of said first and second nodes.

5. The circuit as claimed in claim 2, wherein said second circuit includes a differential amplifier circuit composed of first and second bipolar transistors connected in a differential form, and said first bipolar transistor receives at a base thereof said intermediate signal.

6. The circuit as claimed in claim 4, wherein said second circuit includes first and bipolar transistors connected to form a differential circuit, said first bipolar transistor receiving at a base thereof said intermediate signal and said second bipolar transistor receiving at a base thereof said additional intermediate signal.

7. The circuit as claimed in claim 1, wherein said first circuit further receives a reference voltage indicating said first center level and includes a first MOS transistor of a first channel type connected between a first potential line and a first node, a second MOS transistor of a second channel type connected between said first node and a second potential line, a third MOS transistor of said first channel type connected between said first potential line and a second node, and a fourth MOS transistor of said second channel connected between said second node and said second potential line, said input signal being supplied in common to gates of said first and second MOS transistors, said reference voltage being supplied in common to gates of said third and fourth MOS transistors, and said intermediate signal being led out of said first node.

8. The circuit as claimed in claim 7, wherein said second circuit includes first and second bipolar transistors connected to form a differential circuit, said first bipolar transistor having a base connected to said first node and said second bipolar transistor having a base connected to said second node.

* * * * *